(12) United States Patent
An

(10) Patent No.: US 7,321,949 B2
(45) Date of Patent: Jan. 22, 2008

(54) MEMORY DEVICE INCLUDING SELF-ID INFORMATION

(75) Inventor: Yong Bok An, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 554 days.

(21) Appl. No.: 10/973,375

(22) Filed: Oct. 26, 2004

(65) Prior Publication Data
US 2005/0259478 A1    Nov. 24, 2005

(30) Foreign Application Priority Data
Apr. 28, 2004  (KR) .................... 10-2004-0029602

(51) Int. Cl.
*G11C 5/00*  (2006.01)
(52) U.S. Cl. .................... 711/5; 711/127; 365/230.03; 365/230.04
(58) Field of Classification Search ............ 711/1, 711/5, 127; 365/230.03, 230.04
See application file for complete search history.

(56) References Cited

U.S. PATENT DOCUMENTS

| | | | | |
|---|---|---|---|---|
| 5,471,429 A | * | 11/1995 | Lee et al. .................... | 365/201 |
| 5,798,978 A | * | 8/1998 | Yoo et al. .................... | 365/230.06 |
| 6,094,382 A | * | 7/2000 | Choi et al. .................... | 365/200 |
| 6,367,042 B1 | * | 4/2002 | Phan et al. .................... | 714/733 |
| 2002/0093867 A1 | * | 7/2002 | Muraoka et al. .................... | 365/225.7 |

FOREIGN PATENT DOCUMENTS

KR    100484584    11/1997

* cited by examiner

*Primary Examiner*—Sanjiv Shah
*Assistant Examiner*—Daniel Kim
(74) *Attorney, Agent, or Firm*—Ladas & Parry LLP

(57) ABSTRACT

Disclosed is a memory device including self-ID information. The memory device has a storage unit for storing information related to the memory device, such as a manufacturing factory, a manufacturing date, a wafer number, coordinates on a wafer and the like. Each bank of the memory device stores self-ID information related to the memory device and outputs the self-ID information out of a chip when an address is applied thereto during a test mode.

6 Claims, 13 Drawing Sheets

MEMORY DEVICE INCLUDING SELF-ID INFORMATION

BACKGROUND OF THE INVENTION

1. Field of the Invention

The present invention relates to a memory device having self-ID information, and more particularly to a memory device including an information storage unit for storing information related to the memory device, such as a defect address, a manufacturing factory, a manufacturing date, a wafer number, coordinates on a wafer and the like.

2. Description of the Prior Art

Generally, if a defect is found in a memory device after a packaging process has been completed, it is supposed that other memory devices simultaneously manufactured together with the memory device having the defect have the same defect. Thus, it is necessary to conduct a performance test with respect to the memory devices.

However, in the past, there is no way to find information about the memory device, such as a defect address, a manufacturing factory, a manufacturing date, a wafer number, coordinates on a wafer and the like, so it is very difficult to precisely discriminate memory devices having the defect from among plural memory devices. In addition, relatively long time is required for discriminating the memory devices having the defect from among plural memory devices.

SUMMARY OF THE INVENTION

Accordingly, the present invention has been made to solve the above-mentioned problems occurring in the prior art, and an object of the present invention is to provide a memory device having an information storage unit for storing information related to the memory device.

Another object of the present invention is to provide a technique for easily analyzing information related to a memory device after a packaging process has been completed by reading information stored in an information storage unit by applying a predetermined address adaptable for reading information stored in the information storage unit in a test mode.

In order to accomplish the above objects, according to a first aspect of the present invention, there is provided a memory device including self-ID information, the memory device comprising: a plurality of banks, wherein each bank includes a predecoder for receiving and decoding an address signal, an information storage unit for storing information related to the memory device in such a manner that the information storage unit outputs the information related to the memory device by receiving an output signal of the predecoder, an input/output line driver for receiving the information outputted from the information storage unit, a data output driver for receiving an output signal of the an input/output line driver, and a data pad for receiving an output signal of the data output driver.

According to the preferred embodiment of the present invention, each bank stores the self-ID information related to the memory device and outputs the self-ID information to an exterior according to an address applied thereto during a test mode.

In order to accomplish the above objects, according to a second aspect of the present invention, there is provided a memory device comprising: an information storage section receiving an address and storing the address as information of the memory device; a data output driver receiving an output signal of the information storage section and outputting data in response to a predetermined output control signal; and a data pad receiving an output signal of the data output driver in order to output the output signal of the data output driver out of a chip, wherein the output signal of the information storage section is used as self-ID information of a corresponding chip during the test mode.

According to the preferred embodiment of the present invention, the number of information storage sections is proportional to the number of banks of the memory device.

According to the preferred embodiment of the present invention, the information storage section includes a predecoder for decoding the address by receiving the address, an information storage unit for storing information related to the memory device, and an input/output driver for receiving information outputted from the information storage unit.

According to the preferred embodiment of the present invention, the information storage unit includes a first transistor connected between supply voltage and a first node and N fuse units connected between the first node and a ground, a control signal is applied to a gate of the first transistor in order to transfer the supply voltage to the first node, and data stored in each fuse unit are outputted according to the output signal of the predecoder.

According to the preferred embodiment of the present invention, each fuse unit includes a fuse connected between the first node and a second node and a second transistor connected between the second node and the ground, a gate of the second transistor receives an output signal of the predecoder, the information storage unit outputs a high-level signal if the fuse is a cut-off state when the second transistor is turned on by means of the output signal of the predecoder, and the information storage unit outputs a low-level signal if the fuse is not the cut-off state when the second transistor is turned on by means of the output signal of the predecoder.

According to the preferred embodiment of the present invention, the input/output line driver includes a buffer for receiving an output signal of the information storage unit, a NAND gate for receiving a test mode signal and an output signal of the buffer, a NOR gate for receiving an inverse signal of the test mode signal and the output signal of the buffer, a pull-up transistor connected between supply voltage and the first node, and a pull-down transistor connected between the first node and the ground, an output terminal of the NAND gate is connected to a gate of the pull-up transistor, an output terminal of the NOR gate is connected to a gate of the pull-down transistor, and the first node is an output terminal of the input/output line driver.

In order to accomplish the above objects, according to a third aspect of the present invention, there is provided a memory device comprising: an information storage section receiving an address and storing the address as information of the memory device; a pipe latch for receiving an output signal of the information storage section; a data output driver receiving an output signal of the pipe latch and outputting data in response to a predetermined output control signal; and a data pad receiving an output signal of the data output driver in order to output the output signal of the data output driver out of a chip, wherein the output signal of the information storage section is used as self-ID information of a corresponding chip during the test mode.

According to the preferred embodiment of the present invention, the number of information storage sections is proportional to the number of banks of the memory device.

According to the preferred embodiment of the present invention, the information storage section includes a predecoder for decoding the address by receiving the address, an information storage unit for storing information related to the memory device, and an input/output driver for receiving information outputted from the information storage unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 1:
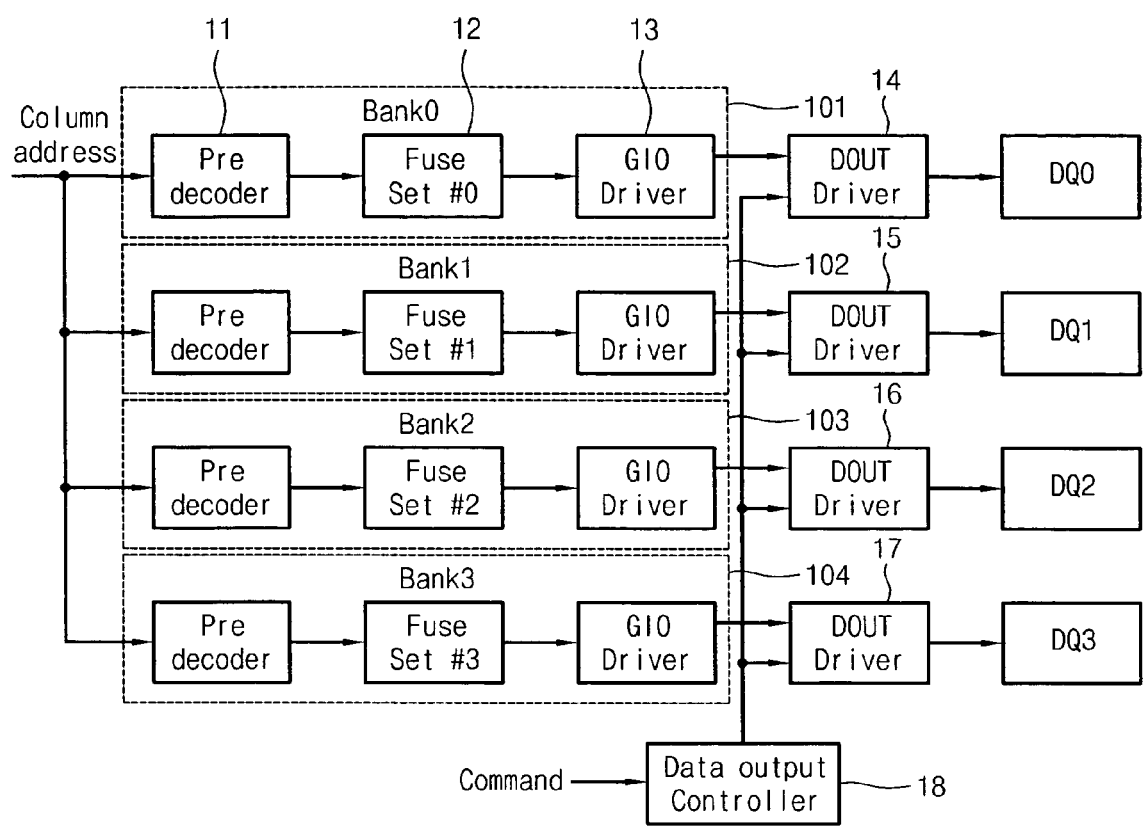
FIG. 1 is a view showing a memory device having an information storage function according to a first embodiment of the present invention.

FIG. 1 is a view showing a memory device having an information storage function according to a first embodiment of the present invention. The memory device shown in FIG. 1 is a four-bank SDRAM memory device.

Referring to FIG. 1, the memory device includes information storage sections 101 to 104, data output drivers 14 to 17, and data pads DQ0 to DQ3. A data output control unit 18 is provided in order to control operations of the data output drivers 14 to 17.

Structures of the information storage sections 102 and 104 for banks 1 to 3 are identical to a structure of the information storage section 101 for a bank 0, so the structures of the information storage sections 102 and 104 will not be further described below in order to avoid redundancy.

The information storage section 101 includes a predecoder 11 for receiving a column address signal, an information storage unit 12 for receiving an output signal of the predecoder 11, and an input/output line driver 13 for transferring information outputted from the information storage unit 12 to a global input/output line of the memory device.

Herein, the information storage section 101 can be formed as a part of a bank generally used for a memory device or can be formed in a peripheral circuit area. That is, the information storage unit 12 signifies a data storage unit of a memory cell array.

Hereinafter, a structure of the predecoder, and structures of the information storage unit and the input/output line driver will be explained in detail with reference to FIGS. 7 to 9, respectively.

Figure 7:
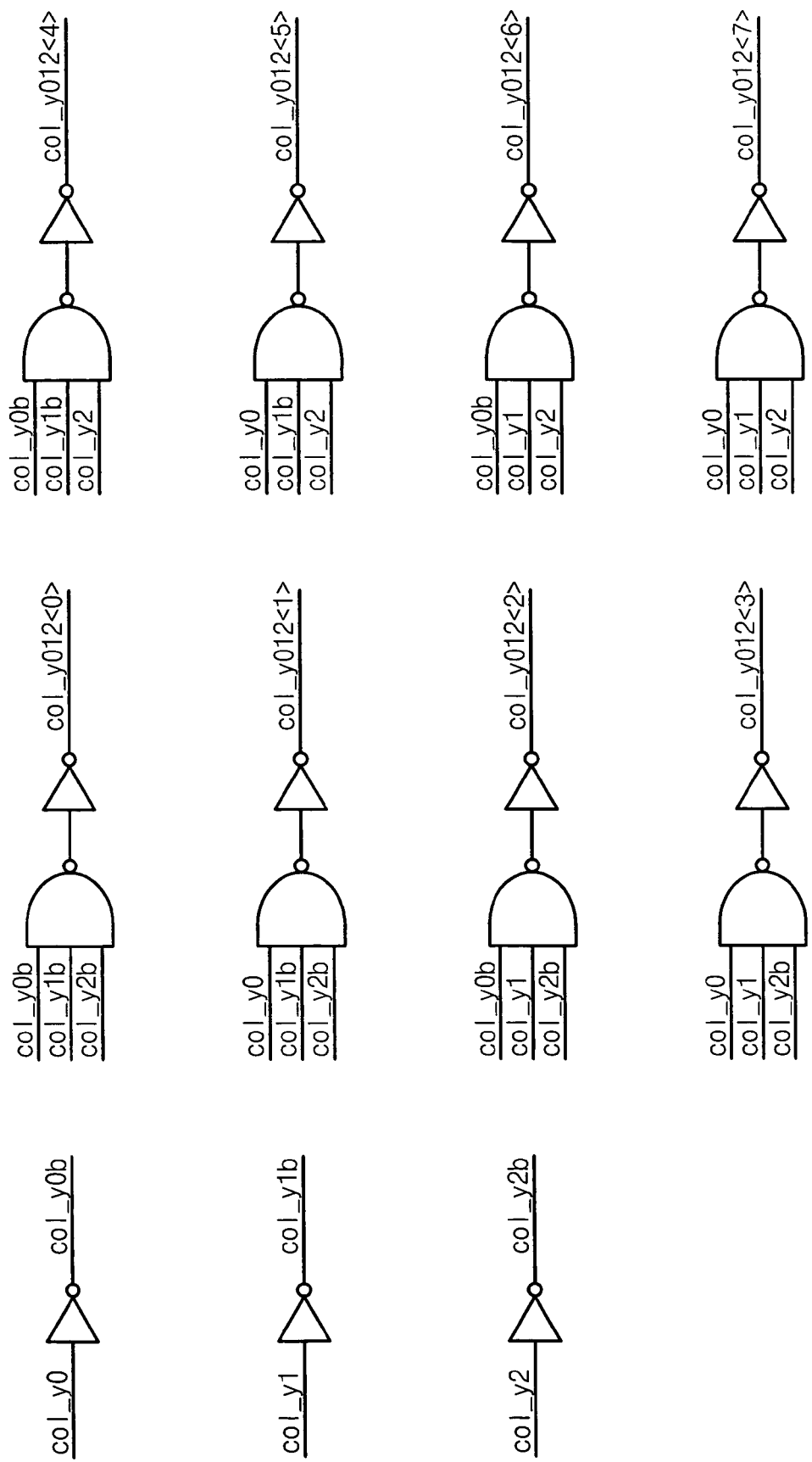
FIG. 7 is a circuit view of a predecoder shown in FIG. 1.

FIG. 7 is a circuit view of the predecoder 11 shown in FIG. 1. The predecoder 11 shown in FIG. 7 is used in a test mode for detecting ID information of the memory device.

As shown in FIG. 7, the predecoder receives column addresses col_y0, col_y1, and col_y2 and outputs predecoded address signals col_y012<0>, col_y012<1>, col_y012<2>, col_y012<3>, col_y012<4>, col_y012<5>, col_y012<6> and col_y012<7>.

In FIG. 7, column addresses col_y0b, col_y1b, and col_y2b are inverse signals of column addresses col_y0, col_y1, and col_y2.

Referring to FIG. 7, the predecoder decodes a column address applied during a read command. It is possible to select data stored in the information storage unit by means of the decoded column addresses.

Figure 8:
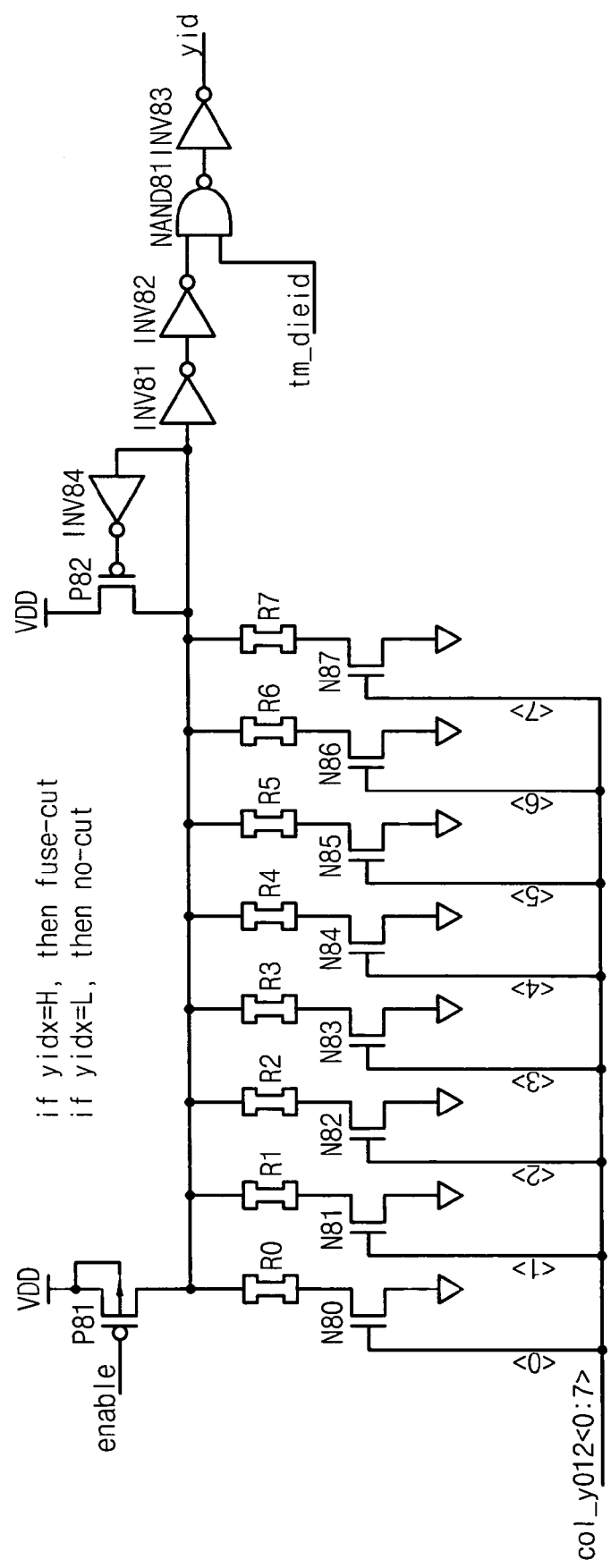
FIG. 8 is a circuit view of an information storage unit shown in FIG. 1.

FIG. 8 is a circuit view of the information storage unit 12 shown in FIG. 1.

The information storage unit 12 shown in FIG. 8 includes a PMOS transistor P81 connected between supply voltage VDD and a node a, and a plurality of fuse units R0-N80, R1-N81, R2-N82, R3-N83, R4-N84, R5-N85, R6-N86, and R7-N87 aligned between the node a and a ground in a row. A control signal (enable) is applied to the PMOS transistor P81.

The fuse unit R0-N80 includes a fuse R0 and an NMOS transistor N80. A decoded column address col_y012<0> is applied to a gate of the NMOS transistor N80.

The fuse unit R1-N81 includes a fuse R1 and an NMOS transistor N81. A decoded column address col_y012<1> is applied to a gate of the NMOS transistor N81.

The fuse unit R2-N82 includes a fuse R2 and an NMOS transistor N82. A decoded column address col_y012<2> is applied to a gate of the NMOS transistor N82.

The fuse unit R3-N83 includes a fuse R3 and an NMOS transistor N83. A decoded column address col_y012<3> is applied to a gate of the NMOS transistor N83.

The fuse unit R4-N84 includes a fuse R4 and an NMOS transistor N84. A decoded column address col_y012<4> is applied to a gate of the NMOS transistor N84.

The fuse unit R5-N85 includes a fuse R5 and an NMOS transistor N85. A decoded column address col_y012<5> is applied to a gate of the NMOS transistor N85.

The fuse unit R6-N86 includes a fuse R6 and an NMOS transistor N86. A decoded column address col_y012<6> is applied to a gate of the NMOS transistor N86.

The fuse unit R7-N87 includes a fuse R7 and an NMOS transistor N87. A decoded column address col_y012<7> is applied to a gate of the NMOS transistor N87.

A signal of the node a is applied to an inverter INV81 and an output signal of the inverter INV81 is applied to an inverter INV82. A NAND gate NAND81 receives a control signal tm_dieid and an output signal of the inverter INV82. The control signal tm_dieid is a test mode signal applied during a test mode in order to detect ID information of a memory chip die. The output signal of the NAND gate NAND81 is applied to an inverter INV 83. An output signal of the inverter INV83 is "yid". Initial electric potential of the node a is maintained in a high level by means of a transistor P82 and an inverter INV84.

Hereinafter, an operation of the information storage unit shown in FIG. 8 will be described.

In the test mode, the test mode signal tm_dieid and the control signal (enable) are enabled with high levels.

Then, if column address signals col_y2, col_y2, and col_y2 applied during a read command are L, L, and H, the output signal col_y012<1> of the predecoder is enabled with a high level.

Accordingly, the NMOS transistor N81 is turned on. At this time, if the fuse R1 is a cut-off state, the output signal of the inverter INV83 becomes a high level. In contrast, if the fuse R1 is not the cut-off state, the output signal of the inverter INV83 becomes a low level. In this manner, predetermined information can be stored according to the cut-off state of the fuse.

Figure 9:
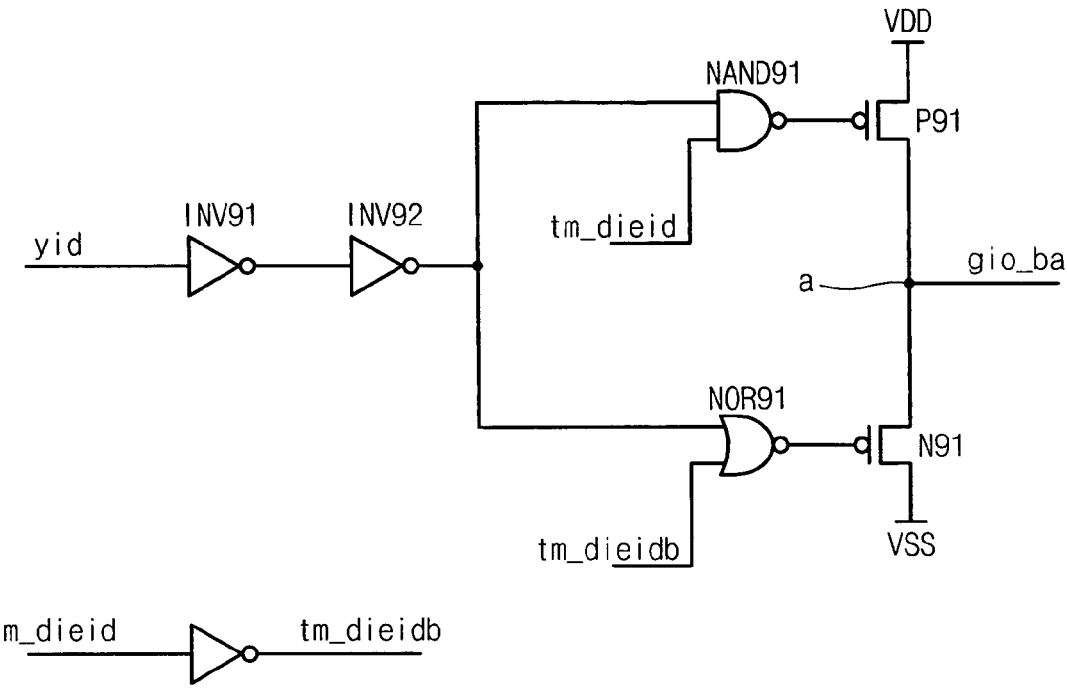
FIG. 9 is a circuit view of an input/output line driver shown in FIG. 1.

FIG. 9 is a circuit view of the input/output line driver 13 shown in FIG. 1.

The input/output line driver 13 shown in FIG. 9 includes buffers INV91 and INV92 for receiving the output signal yid of the information storage unit, a NAND gate NAND91 for receiving the test mode signal tm_dieid and output signals of the buffers INV91 and INV92, a NOR gate NOR91 for receiving an inverse signal tm_dieidb and output signals of the buffers INV91 and INV92, a pull-up transistor P91 connected between supply voltage VDD and the node a, and a pull-down transistor N91 connected between the node a and a ground. An output terminal of the NAND gate NAND91 is connected to a gate of the pull-up transistor P91 and an output terminal of the NOR gate NOR91 is connected to a gate of the pull-down transistor N91. The node a is an output terminal of the input/output line driver 13.

The circuit shown in FIG. 9 operates as follows.

During the test mode, the test mode signal tm_dieid becomes a high level and the inverse test mode signal tm_dieidb becomes a low level.

Therefore, if the output signal yid of the information storage unit, which is shown in FIG. 8, is a high level, an output signal gio_ba of the node a becomes a high level. In contrast, if the output signal yid of the information storage unit is a low level, the output signal gio_ba of the node a becomes a low level. The output signal gio_ba of the node a is transferred to the global input/output line of the memory device.

Hereinafter, an operation of the memory device shown in FIGS. 1, 7 and 9 will be described with reference to timing views shown in FIGS. 3 and 4.

Figure 3:
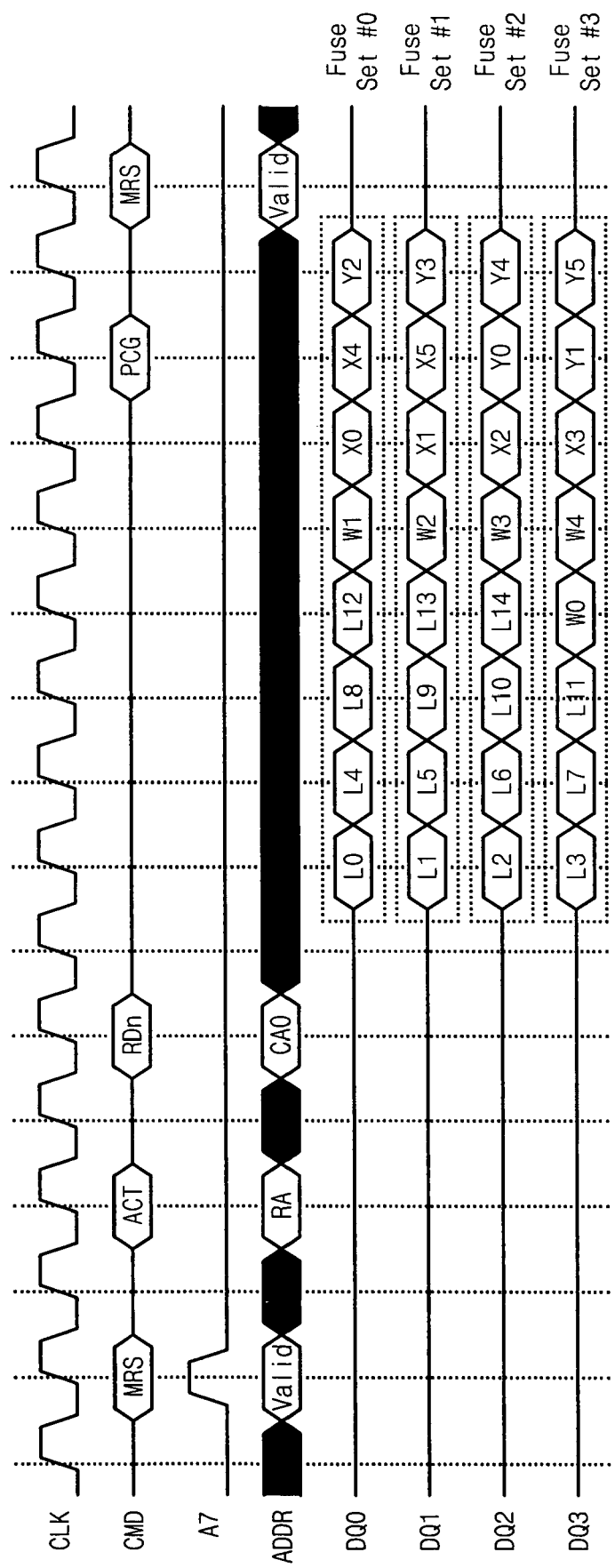
FIG. 3 is a timing view for explaining an operation of an SDRAM having four banks in a test mode.

FIG. 3 is a timing view for explaining an operation of an SDRAM having four banks in a test mode, in which CAS latency is 2 and a burst length is 8.

In FIG. 3, an MRS represents a mode register set for generating a command language during the test mode in order to read ID information of the memory device. An address pin A7 comes into a high level when the MRS generates the command language in order to perform the test mode.

A row address RA is applied according to an ACT command and a column address CA0 is applied according to an RDn command. Herein, the column address CA0 is an address for allocating data stored in the information storage unit during the test mode.

In FIG. 3, "L0-L14", "W0-W4", "X0-X5" and "Y0-Y5" represent data stored in the fuse of the information storage unit. Herein, "L0-L14" includes information related to a manufacturing date, a manufacturing factory, an assembling line, and the like. "W0-W4" includes information related to a wafer number, "X0-X5" includes information related to X-coordinates of a wafer and "Y0-Y5" includes information related to Y-coordinates of the wafer.

Referring to FIG. 3, each information storage unit must have eight fuses R0 to R7. Thus, the four-bank memory device shown in FIG. 1 has 32 fuses. Thus, $2^{32}$ statuses can be represented by combining data stored in 32 fuses with each other.

Thus, 32768 statuses can be represented by using 15 fuses related to "L0-L14" and 32 statuses can be represented by using 5 fuses related to "W0-W4". In addition, 4096 coordinates can be represented by using 6 fuses illustrating X-coordinates and 6 fuses illustrating Y-coordinates on the wafer.

Hereinafter, the timing view shown in FIG. 3 will be explained.

As described above, if the fuse of a transistor selected according to the column address decoded by means of the predecoder is a cut-off state, data becomes a high level. In addition, if the fuse of the transistor selected according to the column address decoded by means of the predecoder is not the cut-off state, data becomes a low level.

Therefore, it is possible to obtain self-ID information of the memory device based on data L0, L4, L8, L12, W1, X0, X4 and Y2 outputted to the data pad DQ0, data L1, L5, L9, L13, W2, X1, X5 and Y3 outputted to the data pad DQ1, data L2, L6, L10, L14, W3, X2, Y0 and Y4 outputted to the data pad DQ2, and data L3, L7, L11, W0, W4, X3, Y1 and Y5 outputted to the data pad DQ3.

Figure 4:
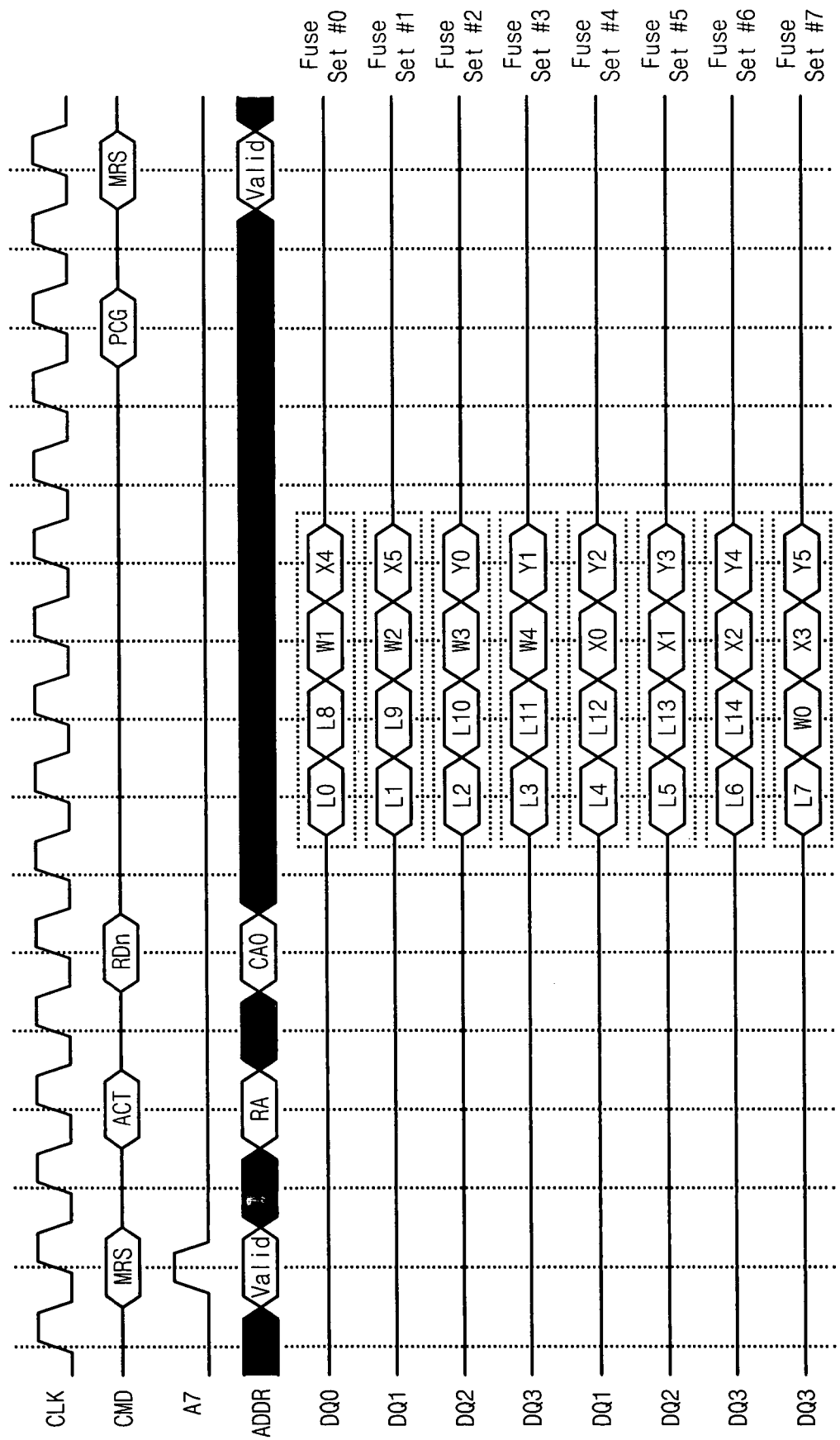
FIG. 4 is a timing view for explaining an operation of an SDRAM having eight banks in a test mode.

FIG. 4 is a timing view for explaining an operation of an SDRAM having eight banks in the test mode, in which CAS latency is 2 and a burst length is 4. In this case, the SDRAM operates in the same manner as the SDRAM shown in FIG. 3, except that the SDRAM shown in FIG. 4 operates with eight banks.

Figure 2:
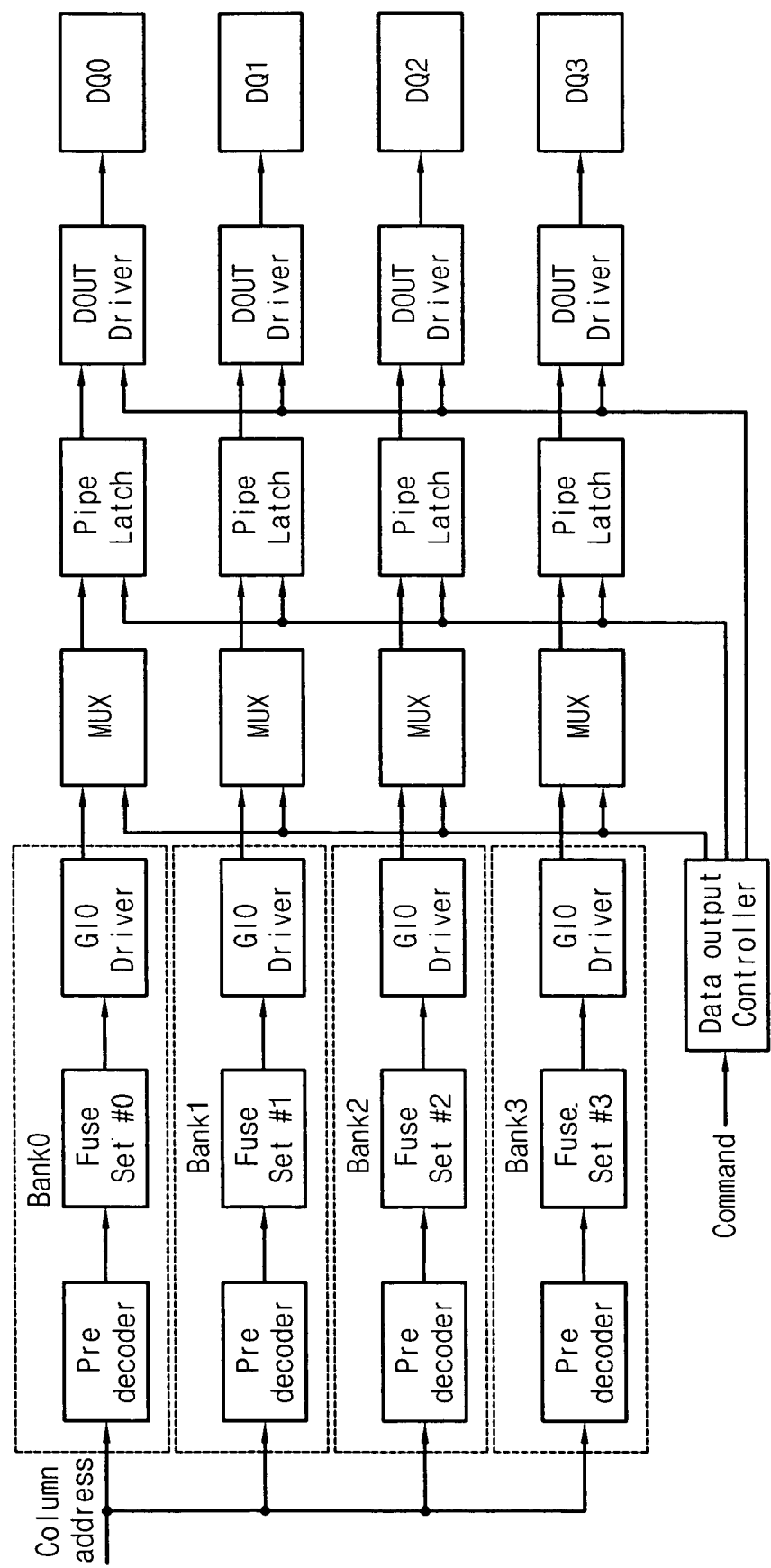
FIG. 2 is a view showing a memory device having an information storage function according to a second embodiment of the present invention.

FIG. 2 is a view showing a memory device having an information storage function according to a second embodiment of the present invention. The memory device shown in FIG. 2 is a four-bank DDR SDRAM memory device.

The memory device shown in FIG. 2 is identical to the memory device shown in FIG. 1, except that the memory device shown in FIG. 1 further includes a multiplexer MUX and a pipe latch between an input/output line driver (GIO Driver) and a data output driver (DOUT Driver). A data output controller controls operations of the multiplexer MUX, the pipe latch and the data output driver (DOUT Driver).

Information storage sections shown in FIG. 2 are identical to information storage sections shown in FIG. 1, so they will not be further described below.

Hereinafter, components (predecoder, information storage unit, and input/output line driver) of a bank shown in FIG. 2 will be described with reference to FIGS. 10 to 12.

Figure 10:
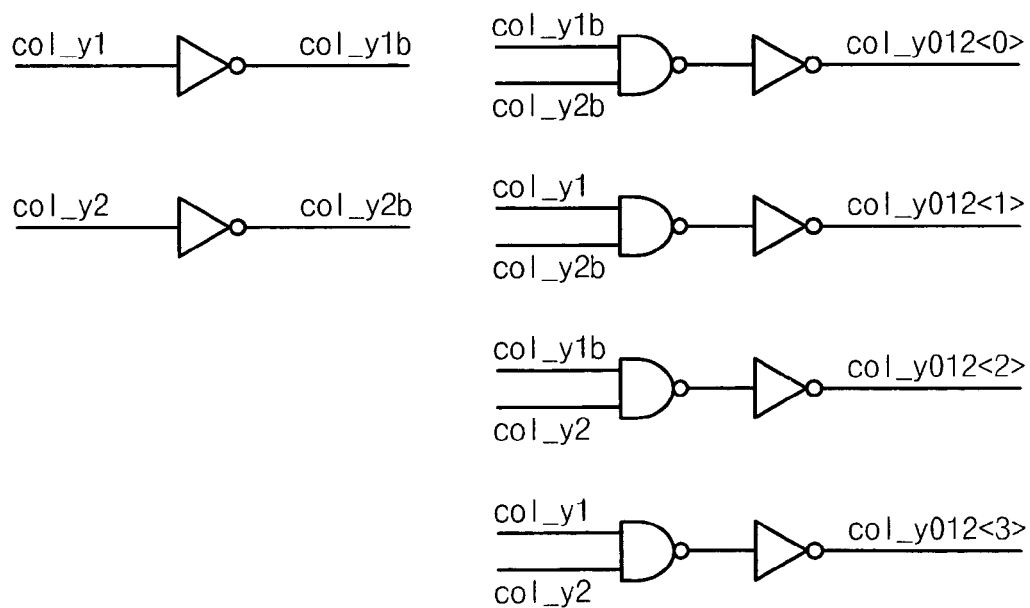
FIG. 10 is a timing view of a predecoder for a column address used in a DDR SDRAM having four banks shown in FIG. 2.

FIG. 10 is a timing view of a predecoder for a column address used in a DDR SDRAM having four banks shown in FIG. 2. The predecoder shown in FIG. 10 is used during the test mode in order to detect ID information of the memory device.

As shown in FIG. 10, the predecoder receives column addresses col_y1, and col_y2 and outputs pre-decoded address signals col_y012<0>, col_y012<1>, col_y012<2>, and col_y012<3>.

In FIG. 10, column addresses col_y1b, and col_y2b are inverse signals of column addresses col_y1, and col_y2.

Referring to FIG. 10, the predecoder decodes a column address applied during a read command. It is possible to select data stored in the information storage unit by means of the decoded column addresses.

Figure 11:
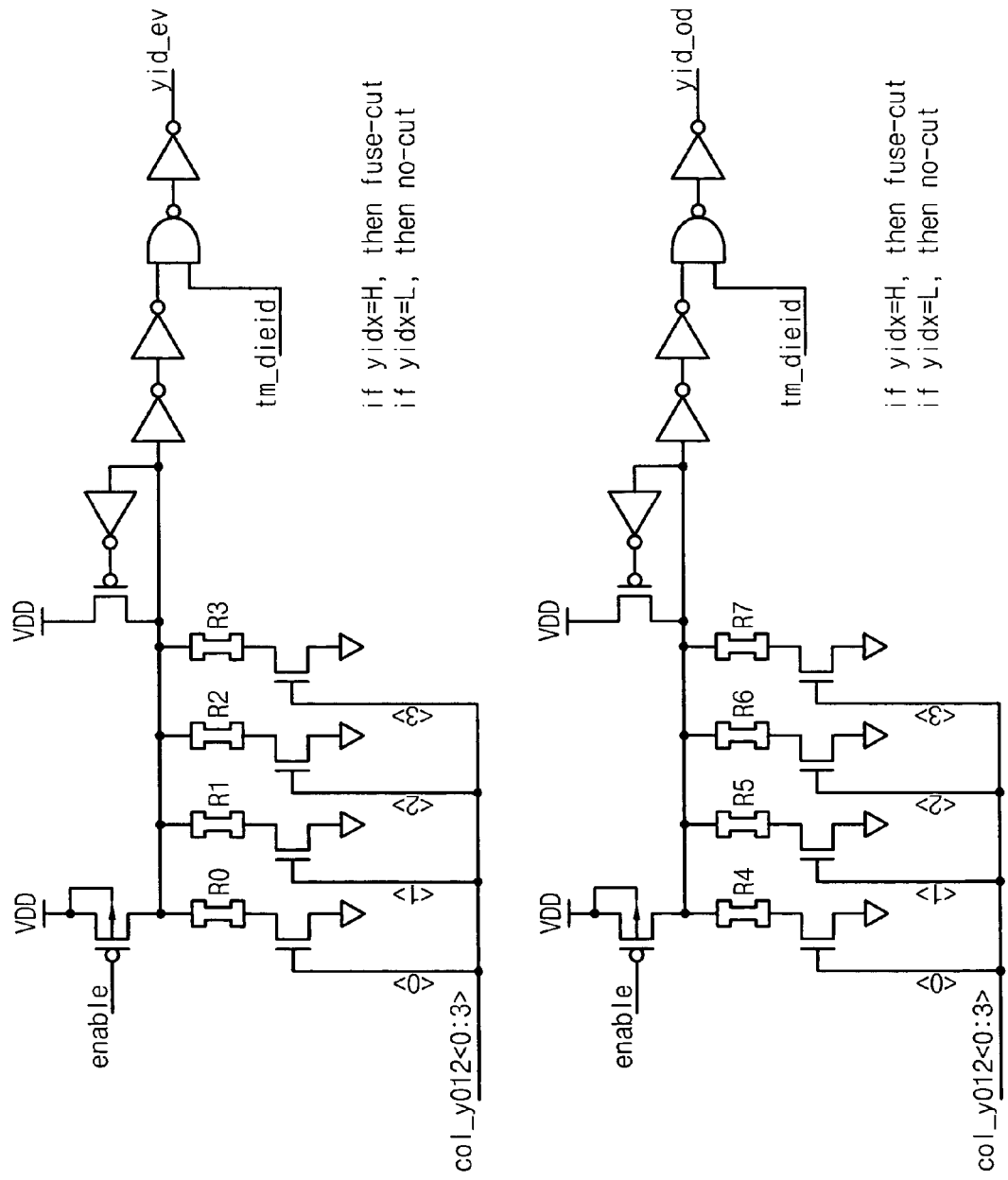
FIG. 11 is a circuit view of an information storage unit shown in FIG. 2.

FIG. 11 is a circuit view of an information storage unit shown in FIG. 2.

The structure of the information storage unit shown in FIG. 11 is identical the structure of the information storage unit shown in FIG. 8, except that the information storage unit shown in FIG. 11 further includes an even block and an odd block because of the characteristics of the DDR SDRAM.

The control signals of FIG. 11 are identical to those of FIG. 8, so they will not be further described below.

Figure 12:
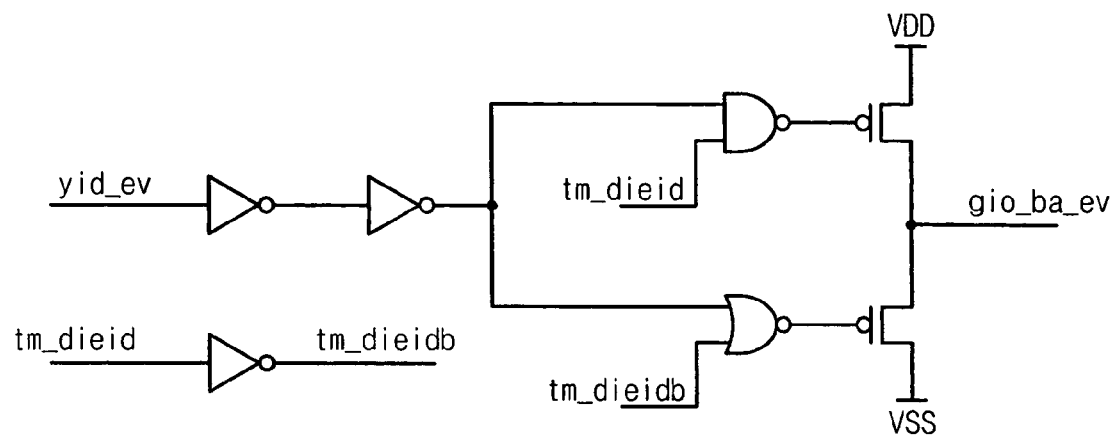
FIG. 12 is a circuit view of an input/output line driver shown in FIG. 2.
Figure 12:
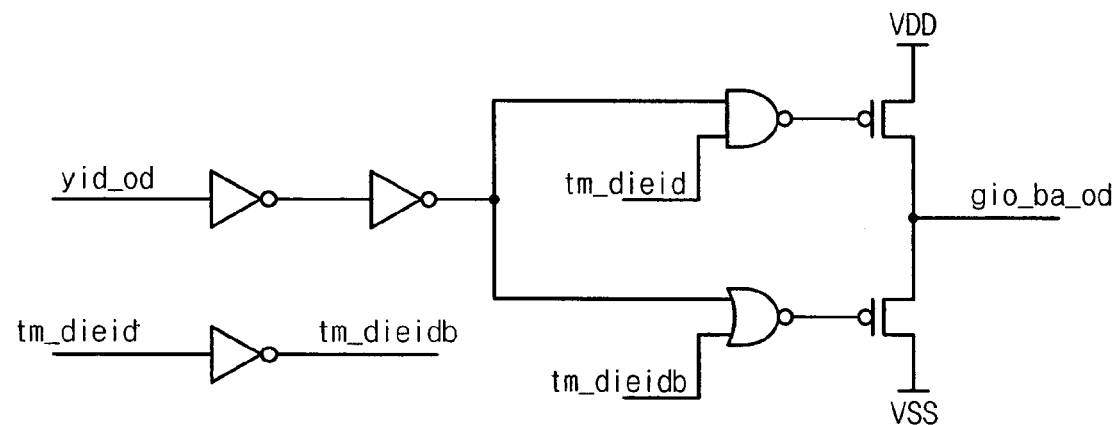

FIG. 12 is a circuit view of an input/output line driver shown in FIG. 2.

A structure of the input/output line driver shown in FIG. 12 is basically identical to the structure of the input/output line driver shown in FIG. 9.

An input/output line driver aligned at a left portion of FIG. 12 receives an output signal of an information storage unit aligned at a left portion of FIG. 11 and used for an even block. In addition, an input/output line driver aligned at a right portion of FIG. 12 receives an output signal of an information storage unit used aligned at a right portion of FIG. 11 and used for an odd block. An operation of the input/output line driver shown in FIG. 12 is identical to the operation of the input/output line driver shown in FIG. 9. In addition, control signals shown in FIG. 12 are identical to control signals shown in FIG. 9.

Figure 5:
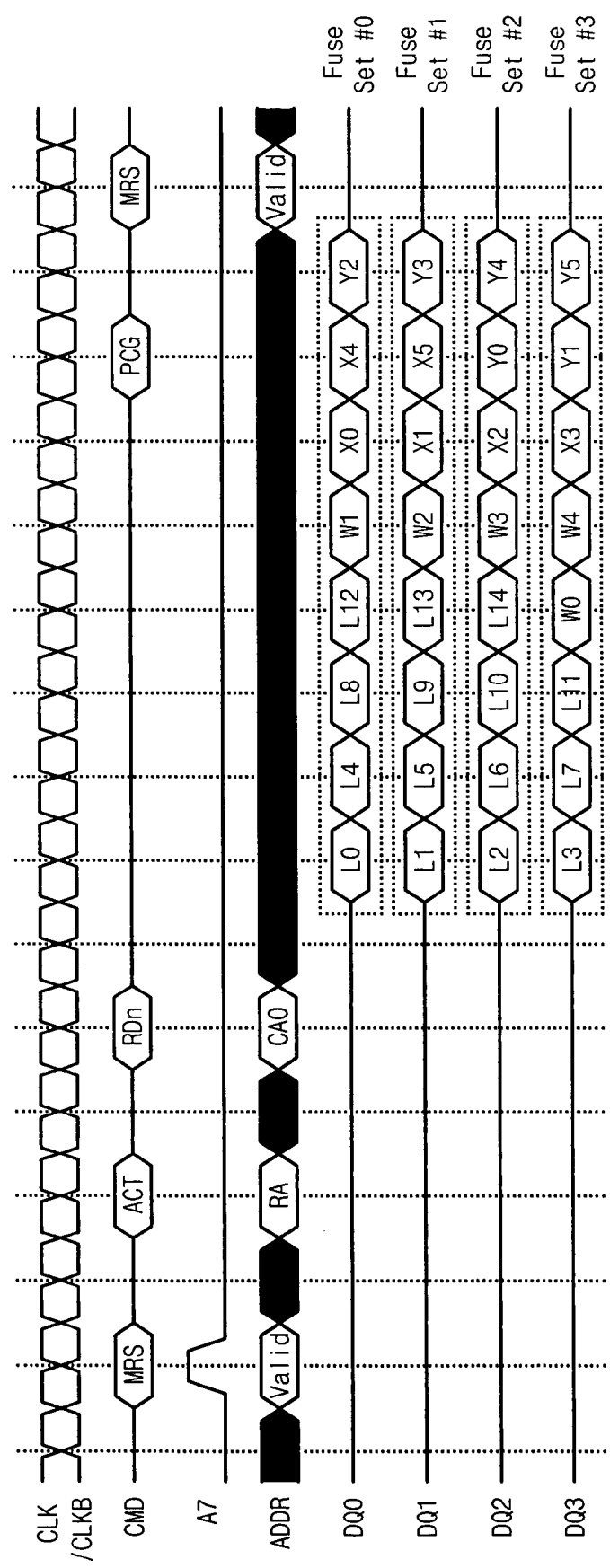
FIG. 5 is a timing view for explaining an operation of a DDR SDRAM having four banks.

FIG. 5 is a timing view showing an operation timing of a DDR SDRAM shown in FIGS. 2 and 10 to 12. The DDR SDRAM shown in FIG. 5 includes four banks, in which CAS latency is 2 and a burst length is 8.

The operation of the DDR SDRAM shown in FIG. 5 is identical to that of the DDR SDRAM shown in FIG. 3, except that the DDR SDRAM shown in FIG. 5 processes data while being synchronized with a rising edge and a falling edge of a clock signal CLK.

Figure 6:
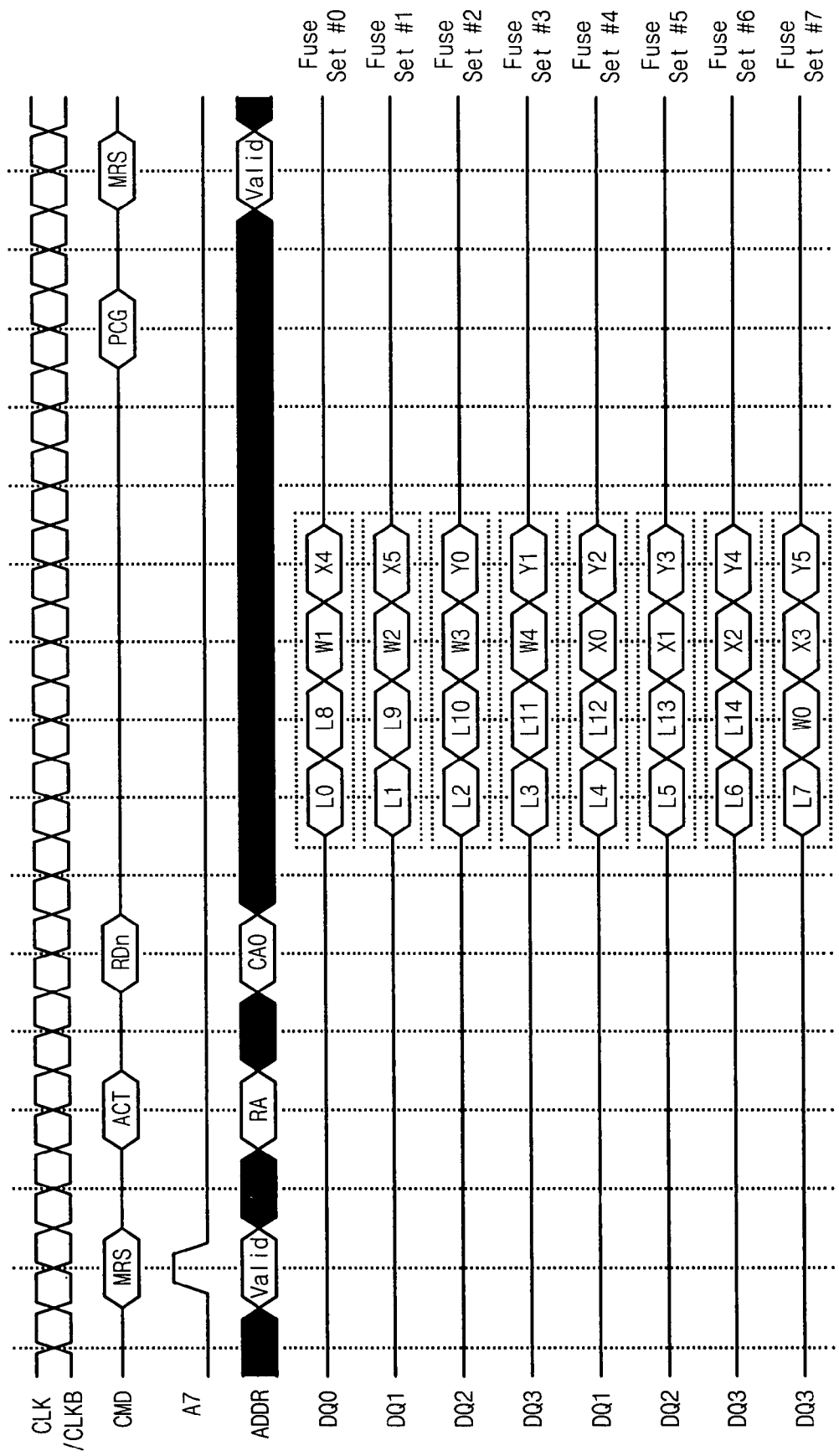
FIG. 6 is a timing view for explaining an operation of a DDR SDRAM having eight banks.

FIG. 6 is a timing view showing an operation timing of a DDR SDRAM shown in FIGS. 2 and 10 to 12. The DDR SDRAM shown in FIG. 5 includes eight banks, in which CAS latency is 2 and a burst length is 4.

The operation of the DDR SDRAM shown in FIG. 6 is identical to that of the DDR SDRAM shown in FIG. 4, except that the DDR SDRAM shown in FIG. 6 processes data while being synchronized with a rising edge and a falling edge of a clock signal CLK.

Figure 13:
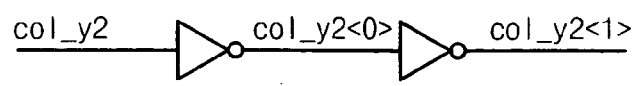
FIG. 13 is a circuit view of a predecoder used in a DDR2 SDRAM having four banks.
Figure 14:
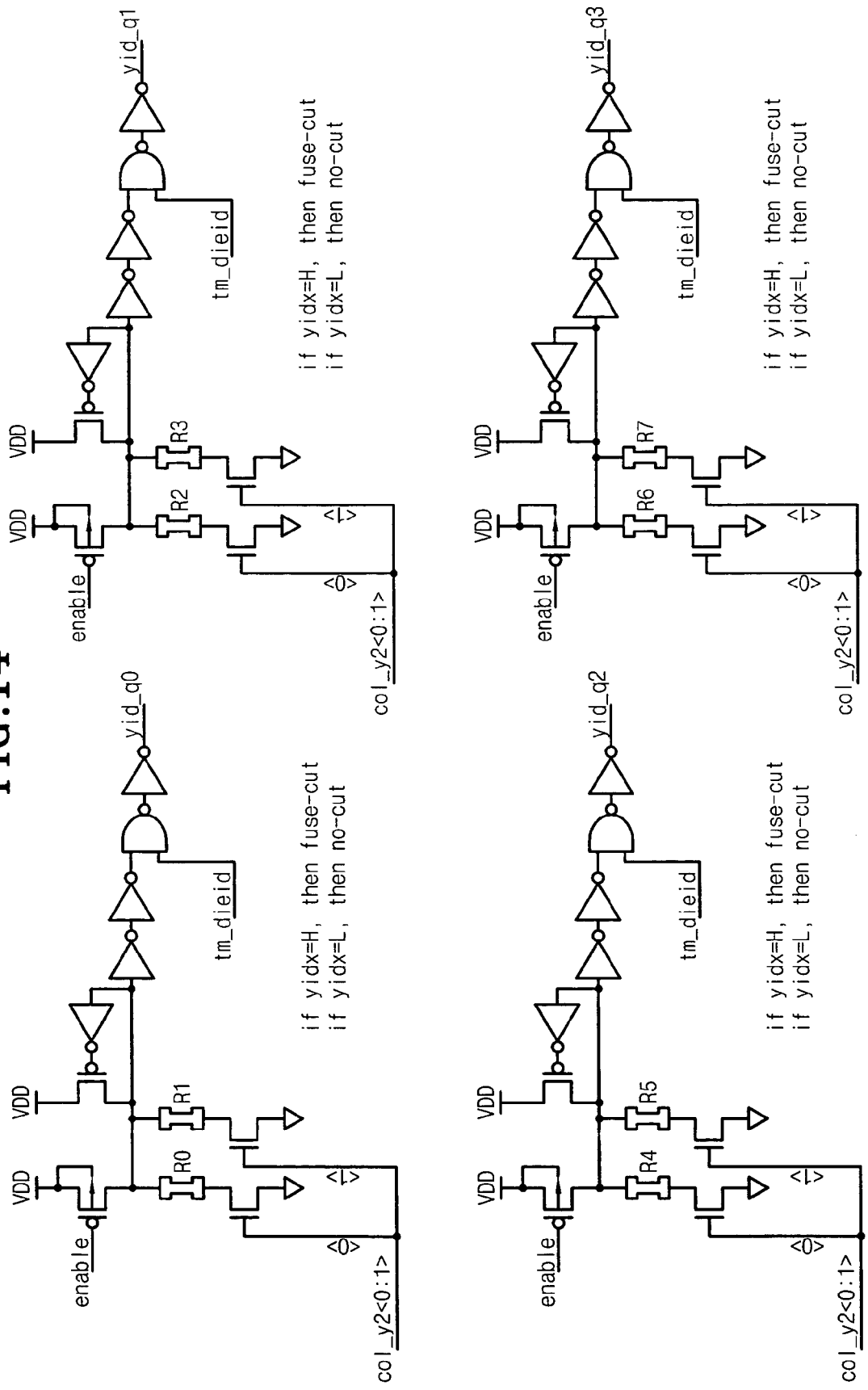
FIG. 14 is a circuit view of an information storage unit used in a DDR2 SDRAM having four banks.
Figure 15:
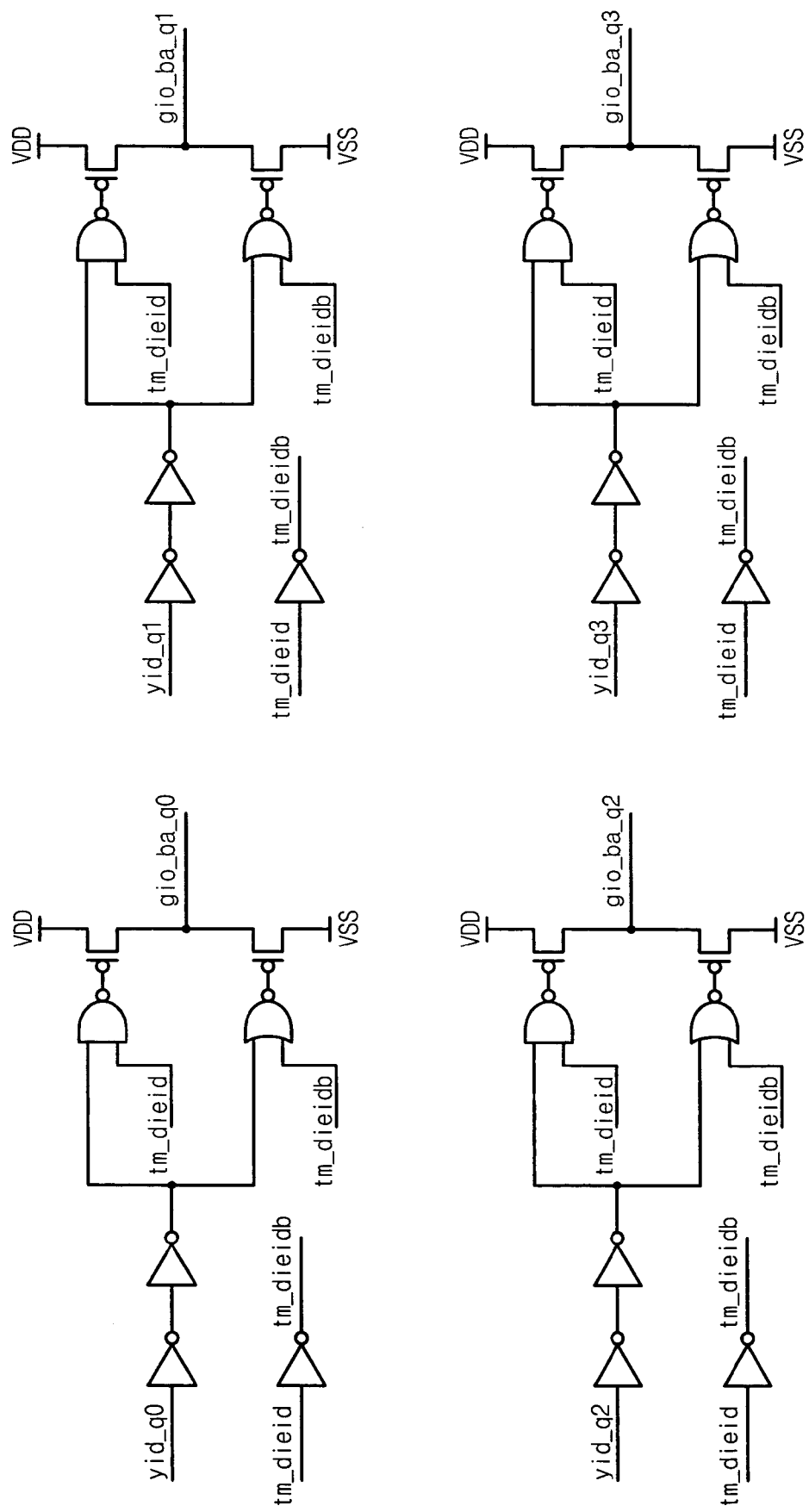
FIG. 15 is a circuit view of an input/output line driver used in a DDR SDRAM having four banks.

FIGS. 13 to 15 are views illustrating that the present invention can be embodied in a DDR2 SDRAM.

FIG. 13 is a view showing a structure of a predecoder used in a DDR2 SDRAM having four banks.

FIG. 14 is a view showing a structure of an information storage unit used in each bank. As shown in FIG. 14, four sub-circuits are provided.

FIG. 15 is a view showing a structure of an input/output line driver used in each bank. As shown in FIG. 15, four sub-circuits are provided.

Basic operations of circuits shown in FIGS. 13 to 15 are identical to those of circuits shown in FIGS. 1 and 2, except that the circuits shown in FIGS. 13 to 15 may process four data during one period of a main clock signal in the test mode.

Although the present invention has been described in relation to the SDRAM, DDR SDRAM and DDR2 SDRAM, the present invention can be used for other memory devices. In addition, the present invention is applicable for memory devices including various banks, other than four banks and eight banks.

As describe above, the present invention can precisely detect information of a semiconductor device including a manufacturing data, an assembling line, a wafer number and coordinates on a wafer by reading data stored in the information storage unit during the test mode. Therefore, it is possible to easily check and find specific position information and characteristic data by using a chip ID.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device including self-ID information, the memory device comprising:
    a plurality of banks, wherein each bank includes;
        a predecoder for receiving and decoding an address signal,
        an information storage unit for storing information related to the memory device in such a manner that the information storage unit outputs the information related to the memory device by receiving an output signal of the predecoder,
        an input/output line driver for receiving the information outputted from the information storage unit,
        a data output driver for receiving an output signal of the an input/output line driver, and
    a data pad for receiving an output signal of the data output driver;
    wherein the information storage unit includes a first transistor connected between supply voltage and a first node and N fuse units connected between the first node and a ground, and wherein a control signal is applied to a gate of the first transistor in order to transfer the supply voltage to the first node, and wherein data stored in each fuse unit are outputted according to the output signal of the predecoder; and
    wherein each fuse unit includes a fuse connected between the first node and a second node and a second transistor connected between the second node and the ground, a gate of the second transistor receives an output signal of the predecoder, the information storage unit outputs a high-level signal if the fuse is a cut-off state when the second transistor is turned on by means of the output signal of the predecoder, and the information storage unit outputs a low-level signal if the fuse is not the cut-off state when the second transistor is turned on by means of the output signal of the predecoder.

2. The memory device as claimed in claim 1, wherein the input/output line driver includes a buffer for receiving an output signal of the information storage unit, a NAND gate for receiving a test mode signal and an output signal of the buffer, a NOR gate for receiving an inverse signal of the test mode signal and the output signal of the buffer, a pull-up transistor connected between supply voltage and the first node, and a pull-down transistor connected between the first node and the ground, an output terminal of the NAND gate is connected to a gate of the pull-up transistor, an output terminal of the NOR gate is connected to a gate of the pull-down transistor, and the first node is an output terminal of the input/output line driver.

3. A memory device comprising:
    an information storage section receiving an address and storing the address as information of the memory device;

a data output driver receiving an output signal of the information storage section and outputting data in response to a predetermined output control signal; and a data pad receiving an output signal of the data output driver in order to output the output signal of the data output driver out of a chip, wherein the output signal of the information storage section is used as self-ID information of a corresponding chip during the test mode;

wherein the information storage section includes a predecoder for decoding the address by receiving the address, an information storage unit for storing information related to the memory device, and an Input/output driver for receiving information outputted from the information storage unit; and wherein the information storage unit includes a first transistor connected between supply voltage and a first node and N fuse units connected between the first node and a ground, a control signal is applied to gate of the first translator in order to transfer the supply voltage to the first node, and data stored in each fuse unit are outputted according to the output signal of the predecoder; and wherein each fuse unit includes a fuse connected between the first node and a second node and a second transistor connected between the second node and the ground, a gate of the second transistor receives an output signal of the predecoder, the information storage unit outputs a high-level signal if the fuse is a out-off state when the second transistor is turned on by means of the output signal of the predecoder, and the information storage unit outputs a low-level signal if the fuse is not the cut-off state when the second transistor is turned on by means of the output signal of the predecoder.

4. The memory device as claimed in claim 3, wherein the input/output line driver includes a buffer for receiving an output signal of the information storage unit, a NAND gate for receiving a test mode signal and an output signal of the buffer, a NOR gate for receiving an inverse signal of the test mode signal and the output signal of the buffer, a pull-up transistor connected between supply voltage and the first node, and a pull-down transistor connected between the first node and the ground, an output terminal of the NAND gate is connected to a gate of the pull-up transistor, an output terminal of the NOR gate is connected to a gate of the pull-down transistor, and the first node is an output terminal of the input/output line driver.

5. A memory device comprising:

an information storage section receiving an address and storing the address as information of the memory device;

a pipe latch for receiving an output signal of the information storage section;

a data output driver receiving an output signal of the pipe latch and outputting data in response to a predetermined output control signal; and a data pad receiving an output signal of the data output driver in order to output the output signal of the data output driver out of a chip, wherein the output signal of the information storage section is used as self-ID information of a corresponding chip during the test mode;

wherein the information storage section includes a predecoder for decoding the address by receiving the address, an information storage unit for storing information related to the memory device, and an input/output driver for receiving information outputted from the information storage unit; and wherein the information storage unit includes a first transistor connected between supply voltage and a first node and N fuse units connected between the first node and a ground, a control signal is applied to a gate of the first transistor in order to transfer the supply voltage to the first node, and data stored in each fuse unit are outputted according to the output signal of the predecoder; and wherein each fuse unit includes a fuse connected between the first node and a second node and a second transistor connected between the second node and the ground, a gate of the second transistor receives an output signal of the predecoder, the information storage unit outputs a high-level signal if the fuse is a cut-off state when the second transistor is turned on by means of the output signal of the predecoder, and the information storage unit outputs a low-level signal if the fuse is not the cut-off state when the second transistor is turned on by means of the output signal of the predecoder.

6. The memory device as claimed In claim 5, wherein the input/output line driver includes a buffer for receiving an output signal of the information storage unit, a NAND gate for receiving a test mode signal and an output signal of the buffer, a NOR gate for receiving an inverse signal of the test mode signal and the output signal of the buffer, a pull-up transistor connected between supply voltage and the first node, and a pull-down transistor connected between the first node and the ground, an output terminal of the NAND gate is connected to a gate of the pull-up transistor, an output terminal of the NOR gate is connected to a gate of the pull-down transistor, and the first node is an output terminal of the input/output line driver.

* * * * *